United States Patent [19]

Sutton

[11] Patent Number: 4,774,420

[45] Date of Patent: Sep. 27, 1988

[54] SCR-MOS CIRCUIT FOR DRIVING ELECTROLUMINESCENT DISPLAYS

[75] Inventor: Stephen L. Sutton, Garland, Tex.

[73] Assignee: Texas Instruments Incorporated, Dallas, Tex.

[21] Appl. No.: 927,894

[22] Filed: Nov. 6, 1986

[51] Int. Cl.⁴ .................. H03K 17/56; H03K 17/72
[52] U.S. Cl. .................................. 307/270; 307/570; 307/631; 307/633; 307/637
[58] Field of Search ............ 307/631, 633, 634, 637, 307/648, 570, 305; 357/23.4, 38, 43

[56] References Cited

U.S. PATENT DOCUMENTS 4,551,643 11/1985 Russell et al. .................... 307/570
4,605,872 8/1986 Rung ................................. 307/631

Primary Examiner—John Zazworsky
Attorney, Agent, or Firm—Richard G. Coalter; Leo N. Heiting; Melvin Sharp

[57] ABSTRACT

Disclosed is a small-area solid state driver (30) adapted for switching high voltages. The driver (30) includes a DMOS device (48) driving a bipolar SCR (58). A SCR NPN transistor (54) and PNP transistor (56) are parasitic in nature, thus reducing the wafer area of the driver (30). The SCR (58) provides current sink capabilities to the driver output (60). Current source capabilities are provided by a substrate input terminal (50) which is connected to the output (60) by diodes (84, 86). A third input (52) allows the SCR (58) to be disabled.

9 Claims, 1 Drawing Sheet

SCR-MOS CIRCUIT FOR DRIVING ELECTROLUMINESCENT DISPLAYS

TECHNICAL FIELD OF THE INVENTION

The present invention relates in general to electrical driver circuits, and more particularly relates to high voltage solid state circuits for driving electroluminescent displays.

BACKGROUND OF THE INVENTION

Electroluminescent displays are gaining popularity for use in displaying alphanumeric text and other matter. This type of display can be a thin film sandwiched unit, having orthoginal arrays of row and column lines. The intersection of an addressed row and column line causes the adjacent luminescent material, or pixel, to become illuminated. By selectively addressing the array row and column lines, alphanumerics can be displayed.

An inherent characteristic of electroluminescent displays is a requirement for a high driving voltage, which may be as high as several hundred volts. An additional requirement is that such a display must be driven by a signal which exhibits an AC component. The AC signal component assures that the display pixels adjacent the array intersections, which are capacitive in nature, do not retain a residual charge when not driven.

Semiconductor driver circuits tailored for driving electroluminescent displays must therefore be able to withstand high voltages, with currents sufficient to charge or discharge the capacitive pixels of the display. Circuits adapted for driving the rows of an electroluminescent display are identified as integrated circuit types SN75552 manufactured by Texas Instruments Incorporated. The noted row drivers include an N-channel double diffused field effect transistor (DMOS) as the device for driving the row lines of electroluminescent displays. In order to supply the requisite current, which may be in the neighborhood of 100 milliamp, the channel width of the FET device must be rather large, in the neighborhood of about 70–80 mils. To accommodate a requisite 225 volt breakdown voltage, the DMOS transistor requires a total of about 300 square mils of wafer area. This represents a substantial chip area, which reduces the number of chips that can be fabricated on a semiconductor slice or wafer. Because of the wafer area required of these conventional DMOS row drivers, the cost disadvantage thereof presents an impediment to the further acceptance and widespread use of electroluminescent displays.

From the foregoing, it can be seen that a need exists for an improved electroluminescent driver which requires less wafer area, without reducing the current drive or voltage breakdown capabilities, so that additional chips can be formed on a wafer. By increasing the number of chips fabricated on a wafer, the process yield increases and the cost of fabrication is reduced.

SUMMARY OF THE INVENTION

In accordance with the present invention, the disclosed electroluminescent driver circuit, and method of fabrication thereof, substantially reduces or eliminates the disadvantages and shortcomings associated with the prior art devices.

According to the electroluminescent row driver of the invention, a small channel area double diffused FET device drives an output bipolar device which has a current gain and breakdown voltage sufficient to drive the rows of an electroluminescent display. The current carried by the FET input device to drive the bipolar device is significantly reduced, thereby allowing the entire driver circuit to occupy a wafer area less than the DMOS drivers heretofore known.

The bipolar device comprises NPN and PNP bipolar transistors connected to form an SCR. A semiconductor substrate is connected in common to both the FET device and the bipolar devices, and in addition provides an input to the driver. The PNP device provides an output of the driver which is capable of sinking current in response to signals applied to the input of the FET device. A diode is connected between the output of the driver and the substrate to source current through the driver output in response to signals applied to the substrate input.

The electroluminescent driver according to the invention is fabricated by utilizing conventional double diffused MOS transistor techniques. The FET input device includes a semiconductor source region, a backgate comprising a conduction channel, and a epitaxial tank forming a semiconductor drain region. The bipolar PNP device is formed adjacent the FET device, and includes a semiconductor region forming an emitter. The base region of the PNP device comprises the epitaxial tank, and a first collector comprises the substrate in which the epitaxial tank is formed. The bipolar NPN device is parasitic in nature, including a semiconductor region comprising the emitter, the backgate region comprising the base, and the epitaxial layer comprising the collector. The bulk resistance of a portion of the backgate region forms a pinch resistor in parallel with the base and emitter of the NPN transistor.

The epitaxial tank forms both the FET drain and the PNP device base, whereby the FET transistor is effective to drive the PNP device of the SCR. The backgate semiconductor region also forms a parasitic second collector of the PNP transistor which is effectively connected to the base of the NPN transistor. As a result, when the SCR is turned on by the FET device, the SCR conduction is self-sustained to discharge the capacitive electroluminescent pixels associated with the driven row.

In accordance with another feature of the invention, an additional input is provided to the row driver for inhibiting the operation of the SCR. To accomplish this, an additional semiconductor region is formed in the backgate region and is responsive to a voltage to reduce the pinch resistance, and prevent the NPN transistor of the SCR from being driven into conduction. The additional control of the SCR prevents false triggering thereof, due to transient currents generated as a result of the actuation of other driver circuits on the chip.

BRIEF DESCRIPTION OF THE DRAWINGS

Further features and advantages will become more apparent from the following and more particular description of the preferred embodiment of the invention, as illustrated in the accompanying drawings in which like reference characters generally refer to the same elements, areas or semiconductor regions throughout the views, and in which.

DETAILED DESCRIPTION OF THE INVENTION

Figure 1:
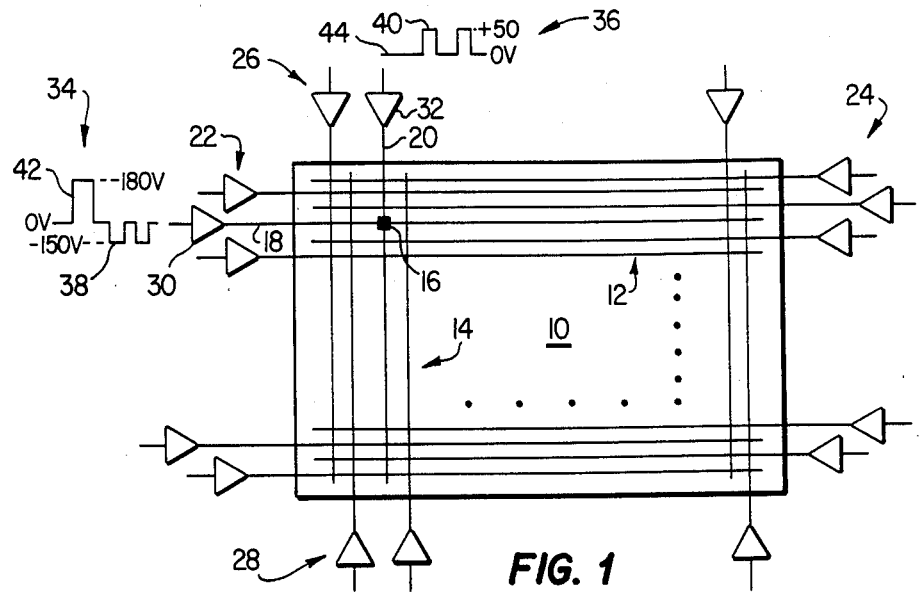
FIG. 1 illustrates an electroluminescent display and associated row and column drivers.

Referring first to FIG. 1 of the drawing, there is illustrated a typical application in which the invention may be advantageously practiced. An electroluminescent display 10 is shown, including a plurality of row lines 12 intersecting with a plurality of column lines 14. A typical nine inch diagonal display 10 may include six hundred forty column lines 14 and two hundred row lines 12. An electroluminescent display of this type can provide a visual display of about a half page of text. In order to accommodate the large number of external connections to the display 10, the row lines 12 are interleaved and appear as external connections on each side of the display 10. The column lines 14 are comparably interleaved to provide electrical access thereto on opposing sides of the display 10.

The display 10 may be constructed using conventional thin film techniques so that a pixel, as illustrated by pixel 16, is defined at the intersection of each row and column line. The pixel area is defined generally by the width of a row line and a column line where an intersection occurs. The pixel 16, for example, can be illuminated by activating row line 18 and column line 20. Various alphanumeric characters can be displayed on the display 10 by illuminating a pattern of pixels. The row lines 12 are driven by drivers 22 and 24. The column lines are similarly driven by drivers 26 and 28. It can be appreciated that a large number of drivers are required in order to selectively illuminate desired pixels of the display 10. As a result, the economizing of wafer area and cost of each driver is cumulative, and thus can be appreciable when a large number of drivers are involved.

Because of the nature of the electroluminescent display 10, the voltage across the pixel 16 must be in the neighborhood of two hundred volts in order for it to be illuminated. One driving scheme which has become standardized involves driving the row lines with a negative voltage, and driving the column lines with a positive voltage, the voltage difference therebetween being the requisite two hundred volts. The voltage waveform 34 illustrates the standard row driving voltage, while the waveform 36 illustrates the standard column driving waveform.

Specifically, the voltage pulse 38 of waveform 34 is effective to drive the row line 18 at a voltage of about −150 volt. Concurrent with the negative pulse 38, the column line 20 is driven with a positive fifty volt pulse 40, thereby placing about two hundred volts across the sandwiched electroluminescent material in the area of pixel 16. In the addressing scheme for illuminating desired pixels of the display 10, all the row lines 12 are sequentially accessed, one at a time, by applying a voltage pulse thereto, similar to that of 38. During the driving of each row line 12, desired column lines 14 are driven with pulses 40 to illuminate desired pixels associated with the driven row line. As the row lines 12 are sequentially driven with the concurrent driving of selected column lines 14, a pattern of pixels can be generated on the face of the display 10. In this manner, the display 10 can present alphanumerics and other graphical data.

In order to restore an AC driving component to the display 10 to prevent an eventual residual charge, the row lines 12 are driven in such a manner as to exhibit an AC component. A charge buildup at a pixel site destroys the voltage/brightness relationship such that for given driving voltages, pixel brightnesses no longer follow an original characteristic curve. The AC restoration is accomplished by initially driving each row line 12 during the scanning process with a large positive pulse 42. This has the effect of offsetting the negative pulses 38 so that the display 10 experiences an AC voltage. During the time the positive pulse 42 is applied to the row lines 12, the column lines 14 remain at essentially zero volts, as indicated by reference character 44. The voltage across each pixel is thus reversed, and at a magnitude of about one hundred eighty volts. The one hundred eighty volts magnitude is insufficient to illuminate the pixels 16, and thus the display retains the pixel pattern currently presented.

As noted above, the row line drivers 22 and 24 must withstand a large voltage and a medium current, as compared to the column line drivers 26 and 28. This can be appreciated, as when row line driver 30 is activated, its current sink capabilities must accommodate that which is sourced by each of the column line drivers 26 and 28 which are also activated. Therefore, while not specifically limited thereto, the present invention is directed primarily to the improvement of the row line drivers 22 and 24.

Figure 2:
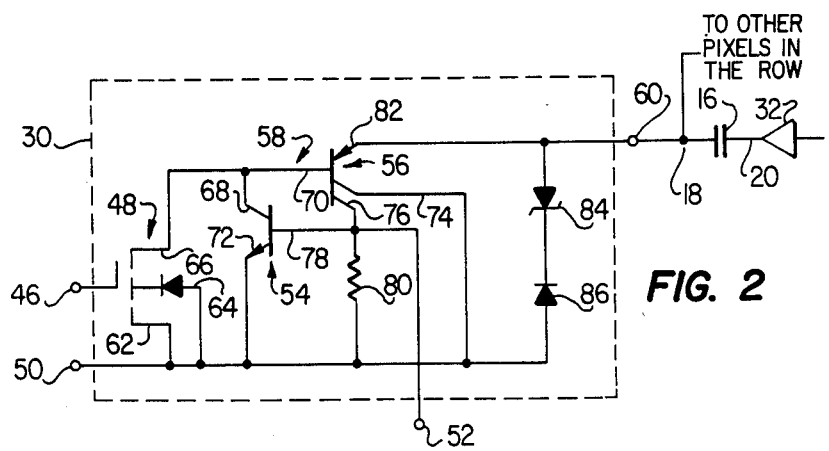
FIG. 2 is an electrical schematic drawing of a driver constructed in accordance with the invention.

A row line driver 30 constructed in accordance with the preferred embodiment of the invention is illustrated in FIG. 2. The driver 30 includes a first input 46 comprising the gate of a DMOS N-channel field effect transistor 48. A second input 50 to the driver 30 comprises a substrate connection. A third input 52, to be described in more detail below, is connected to an NPN bipolar transistor 54 and a PNP bipolar transistor 56 connected in such a manner to form an SCR 58. An output of the driver 30 is identified as reference character 60.

More particularly, a source terminal 62 and backgate terminal 64 of the DMOS device 48 are connected together to the substrate terminal 50. The drain terminal 66 of the DMOS device 48 is connected to the collector 68 of the NPN device 54, and to the base 70 of the PNP device 56. The emitter 72 of the NPN device 54 is connected to the substrate terminal 50, as is the first collector terminal 74 of the PNP device 56. The second collector terminal 76 of the PNP device 56 is connected to the base 78 of the NPN device 54, both such terminals being connected in common to the third input 52, as well as through a resistor 80 to the substrate contact 50. The emitter 82 of the PNP device 56 is connected in parallel to the driver output 60, and through series connected diodes 84 and 86 to the substrate contact 50. Diode 84 is of the Zener type, having a breakdown voltage of about 6.8 volts. The diodes 84 and 86 are poled such that a positive voltage applied to the substrate terminal 50 forward biases diode 86 and breaks down Zener diode 84 to provide a driving current through the output 60. The driver 30 is also capable of sinking current from the output 60 through the SCR 58 when driven into its conductive state.

The DMOS transistor 48 includes a small area conduction channel for driving the SCR 58 with relatively small currents. In this manner, the DMOS device 48 need not sink the output current of the driver 30, and thus its wafer area can be reduced by a factor of up to ten. Indeed, the area thus conserved by far accommodates the wafer area needed for the SCR 58. This will be appreciated when it is understood by the description below that many elements of the SCR 58 are parasitic or inherent, and thus no additional wafer area is required in the fabrication.

In operation, when it is desired to refresh the display 10 with an AC component, such as with positive pulse 42, such signal is applied to the substrate input 50. No signal is applied to the gate input 46 of the DMOS device 48. With the one hundred eighty volt signal 42 applied to the substrate input 50, diode 86 is forward biased, and Zener diode 84 is broken down, whereby substantially the full voltage (172.5V) is applied to the driver output 60 to charge the capacitance of the pixels associated with the driven row. The input of column driver 32 remains at zero volts so that the pixel capacitance is charged to the noted voltage, with a positive polarity on the driver output 60 side of the pixels. On the negative transition of positive pulse 42, diode 86 becomes reversed biased. However, an input is then applied to the gate 46 of the DMOS device 48 so that it is driven into conduction. With the DMOS device 48 conducting, the PNP transistor 56 is also driven into conduction. Because of the SCR connection of bipolar transistors 54 and 56, when PNP transistor 56 is driven into conduction, it also drives transistor 54 into conduction thereby latching both such bipolar transistors in a conduction state. As a result, the capacitance of the pixel 16, as well as all the other pixels in the driven row, is quickly discharged through the SCR to the substrate terminal 50. The current through the SCR 58 is extinguished automatically when the capacitances of the pixels are fully discharged. The bipolar transistors 54 and 56 are constructed having a current gain, and thus can handle the row currents without an attendant increase in wafer area. As noted above, a pixel 16 driven with this magnitude of refresh voltage is not illuminated. The refresh period typically lasts for only about one hundred microseconds, and therefore does not effect the pattern of illuminated pixels as viewed by the human eye.

A pattern is generated on the display 10 by selectively driving the column drivers 26 and 28 during the cyclical sequential driving of the row line drivers 22 and 24. As noted above, a pixel, for example pixel 16, is illuminated by simultaneously driving row line driver 30 and column line driver 32 to impress a voltage of about two hundred volts across the pixel 16. To accomplish this, a negative one hundred fifty volt pulse 38 is applied to the substrate input 50, and at the same time a signal is applied to the driver input 46, thereby driving the DMOS transistor 48 into conduction. The SCR 58 is thus also driven into conduction, wherein the driver output 60 applies about the full negative one hundred fifty volt level to the row line 18. At the same time, the fifty volt positive pulse 40 is applied to the column line driver 32 so that substantially the full fifty volts is applied to the other side of the pixel 16 through column line 20. As a result, the pixel 16 experiences a two hundred volt difference across it which is sufficient for illumination thereof.

In addition to carrying the capacitive current of the selected pixel 16, the driver SCR 58 also carries the current of all other pixels in the row 18 which are selectively driven by respective column line drivers 26 and 28. In the event all six hundred forty pixels associated with the row line 18 in the exemplary display 10 were driven by the respective column line drivers 26 and 28, a single row line driver 30 would be required to sink a maximum current of about 100 ma. The column current, and thus the row current, is limited in a conventional manner by the voltage ramp of each column driver 26 and 28. When a row pattern of pixels requires less than all pixels to be illuminated, fewer column line drivers are driven, and thus the associated driven row line driver will carry correspondingly less current. Each row line driver 22 and 24 is driven sequentially, such that any one column line driver 26 need only supply driving current to a single pixel associated with a driven row.

Figure 3:
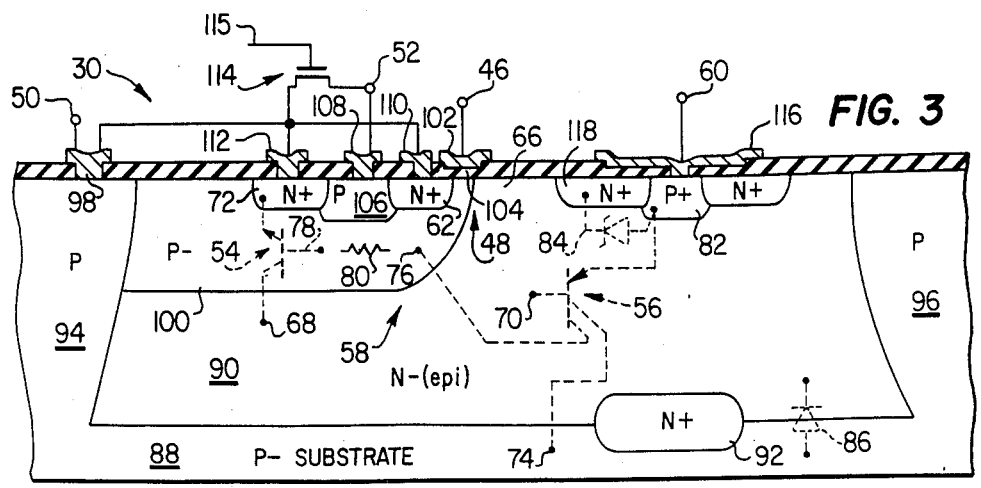
FIG. 3 is a cross-sectional view of a wafer illustrating the various semiconductor areas forming the driver of the invention.

FIG. 3 illustrates the fabrication of the row line driver 30 constructed in accordance with conventional silicon fabrication techniques. The fabrication of DMOS devices and bipolar devices is fully described in U.S. Pat. Nos. 4,325,180; 4,403,395 and 4,546,370, all assigned to the assignee hereof. The subject matter of the three noted patents is incorporated herein by reference. The ensuing description of the semiconductor structure of FIG. 3, together with the teachings of the noted patents, will enable those skilled in the art to fabricate the row line driver 30 according to the present invention.

The row line driver 30 is fabricated starting with a P-type substrate 88, and with an N-type tank or epitaxial layer 90 deposited thereon. A heavily doped N+ buried layer 92 is formed therebetween. The epitaxial layer 90 is laterally isolated from other similar drivers by P-type diffusions 94 and 96. The substrate input terminal 50 is connected by metallization 98 to the isolation diffusion region 94 which, in turn, is in electrical contact with the substrate 88. The substrate 88 and the isolation diffusion 94 are both constructed of a P-type impurity and thus the substrate terminal 50 is in electrical contact with the underlying substrate 88. In actual practice, isolation diffusions 94 and 96 are a single diffusion which encircle the epitaxial layer 90, and thus are indistinguishable from each other.

A lightly doped backgate well 100 is formed in the N-type epitaxial layer 90 in a conventional manner, and is self aligned together with a heavily doped N-type DMOS source region 62. Subsequent elevated temperatures of the wafer cause the backgate region 100 to diffuse laterally outwardly, as shown. The semiconductor drain region 66 of the DMOS device 48 comprises a portion of the epitaxial layer 90. The gate input 46 is connected to a gate metallization 102 which overlies a thin gate oxide 104.

An additional heavily doped N+ semiconductor region 72 is formed in the backgate region 100 and forms the emitter of the NPN transistor 54. In practice, the N+ regions are a single diffusion formed in a toroid shape. The parasitic elements of the row line driver 30 are generally shown as circuit elements in broken lines. The base 78 of the NPN transistor 54 comprises a portion of the backgate semiconductor region 100, while the collector 68 of the transistor 54 comprises a portion of the epitaxial layer 90. The base pinch resistor 80 associated with the transistor 54 comprises the bulk resistance of a portion of the backgate semiconductor region 100. A P-type semiconductor region 106 is formed in the backgate region 100, intermediate the N+ regions 62 and 72. Metallization contact 108 is made to the P region 106, and also to the third input 52. As will be described in more detail below, when a potential is applied to the P semiconductor region 106, the resistance of the pinch resistor 80 is affected.

Metallization electrodes 110 and 112 make contact with the respective N+ regions 62 and 72, and are both connected externally to the substrate metal 98. Thus, any potential applied to the substrate input terminal 50 is also applied to the N+ regions 62 and 72. An N-channel enhancement mode transistor 114 has a drain connected to metallization 108, and thus to the input 52. Transistor 114 further includes a source connected to the substrate metallization 98. The gate 115 of the device 114 can be driven with a voltage which is an inverted representation of the signal driving the gate input 46 of the DMOS device 48.

A heavily doped P+ semiconductor region 82, forming an emitter of the PNP transistor 56, is formed in the epitaxial layer 90. Metallization 116 provides a conductor between the row line driver output 60 and the PNP transistor emitter 82. An N+ semiconductor region 118 encircles the P region 82 and forms the Zener diode 84. The epitaxial layer 90 forms the base 70 of the PNP transistor 56. A portion of the substrate 88 forms one collector 74 of the PNP transistor 56, while a portion of the backgate 100 forms the other collector 76 of the PNP transistor 56.

When a large negative voltage is applied to the substrate 88, via the substrate input terminal 50, the heavily doped buried layer 92 prevents a depletion region from extending into the overlying P+ PNP transistor emitter region 82. The diode 86 is formed by the junction between the P-type substrate 88 and the N-type epitaxial layer 90. As noted above, the Zener diode 84 comprises the junction between the P+ emitter region 82 and the heavily doped N-type semiconductor region 118. The PNP transistor breakdown voltage is maintained sufficiently high to withstand the high driving voltages by separating the N+ buried layer 92 sufficiently from the P backgate 100.

In operation, when the positive refresh pulse 42 is applied to the substrate input terminal 50, the PN junction forming diode 86 is forward biased and thus current is conducted from the terminal 50 into the epitaxial layer 90. When the junction formed between the P+ and N+ regions 82 and 118 (the Zener diode 84) is broken down, current is conducted from the epitaxial layer 90 and through the output terminal 60. On the negative transistion of the positive refresh pulse 42, a signal is applied to the gate input 46 of the DMOS device 48.

During the negative transistion of the positive refresh pulse 42, the PN junction forming the diode 86 becomes reverse biased, and thus current cannot be conducted from the epitaxial layer 90 to either the substrate 88 or the isolation diffusion 94. However, the DMOS device 48 is driven into conduction by a signal applied to the gate 46, whereby the DMOS device drain 66, which is constructed of semiconductor material common with the PNP transistor base 70, drives such transistor into conduction. The collected carriers from the PNP transistor 56 are carried to adjacent P-type semiconductor regions, namely the substrate 88, and the backgate 100. The PNP transistor collectors 74 and 76 are thus indicated as existing in these P-type regions. However, the base of the SCR NPN transistor 54 is located in the backgate 100, and thus the carriers from the PNP transistor 56 represent a current flow through the backgate semiconductor region 100 to the NPN transistor base 78. At least a portion of the PNP transistor current flows through the pinch resistor 80 and developes a voltage thereacross. When the voltage in the backgate region 100 rises about 0.7 volt above the voltage in the NPN emitter region 72, the transistor 54 is driven into conduction. Since the collector 68 of the NPN transistor 54 is formed in the same epitaxial layer 90 as is the base 70 of the PNP transistor 56, the combination forms an SCR which is latched in the conduction state until extinguished by the current discharged by the column selected pixels associated with the driven row. The major current flow through the NPN transistor 54 is from the collector 68 through the emitter 72, and out of metallization electrode 112 to the substrate input terminal 50. Hence, it can be seen that when the DMOS device 48 is turned on, a small amount of current is sufficient to drive the PNP transistor 56 into conduction, which conduction is sustained by the NPN transistor 54.

During the negative row line driving pulse 38 which is applied to the substrate input terminal 50, the DMOS device 48 is also turned on by the application of a signal to the gate input 46 thereof. The DMOS device 48 thus triggers the SCR 58 into conduction, thereby providing a current discharge path between the driven pixel row line and the substrate input 50.

When, for example, the row line driver 30 is not to be activated to thereby drive the row line, the DMOS device gate 46 is not driven with a corresponding signal and such device remains in a nonconductive state. It is realized, however, that during normal row line accessing, the waveform 34 is applied simultaneously to the substrate input 50 of all row line drivers 22 and 24, but only one row line driver receives a gate drive to its associated DMOS input device. During routine row addressing, various parasitic transient currents are generated within the junction capacitances of the driver 30. These parasitic currents can inadvertently trigger the SCR 58 into conduction and drive a row line out of its turn in the sequence. As a result, two or more row lines would be driven simultaneously and thus duplicate the pattern as represented by the activated column line drivers 26 and 28.

FET transistor 114 is provided for preventing the inadvertent triggering of the SCR 58. Thus, for all the row line drivers which are not to be activated during the sequence, a signal would be applied to the third input 52, or in the present case to the gate 115 of transistor 114. When transistor 114 is driven into conduction, the P region 106 is connected through transistor 114 to the substrate input terminal 50. As a result, the region 106 provides a P-type conduction channel for the carriers generated by the PNP transistor collector 76. In this manner, the carriers do not flow through the bulk resistance 80 of the backgate region 100, and thus the base-emitter junction of the NPN transistor 54 does not become forward biased. Therefore, by driving transistor 114 into conduction, the carriers of the PNP transistor collector 76 are short circuited or rerouted to the region 106, and thus are not able to debias the backgate resistance 80.

TECHNICAL ADVANTAGES OF THE INVENTION

From the foregoing, an improved solid state driver has been disclosed. The solid state driver is particularly advantageous when used in connection with driving electroluminescent displays. A technical advantage of the driver of the invention is that the fabrication thereof realizes a significant reduction in wafer area, while yet being able to withstand high voltages and requisite driving currents. An additional technical advantage presented by the invention is that small area bipolar devices with current gains are used for switching the drive currents, while a small area high voltage DMOS device is used as an input device. Yet another technical advantage of the invention is that the wafer area can be considerably conserved by realizing that various parasitic regions can form the bipolar-SCR section of the driver. By capitalizing on the parasitic device operation, the driver of the invention can be fabricated with modifications to silicon semiconductor processing techniques utilized to construct the prior well-known devices. For 225 volt, 100 ma operation, the SCR-DMOS driver of the invention can be constructed using about one third the wafer area of the DMOS drivers heretofore known. In addition, for high current operation ranging up to one amp, the SCR-DMOS driver of invention can be constructed in a wafer area about one thirtieth the area required of a DMOS device having comparable driving capabilities. Thus, the advantages of the invention become even more significant as the current drive requirements increase.

While the preferred embodiment of the invention has been disclosed with reference to a specific row line driver, it is to be understood that many changed in detail may be made as a matter of engineering choices without departing from the spirit and scope of the invention, as defined by the appended claims.

I claim:

1. A solid state driver, comprising:
   a field efect device comprising a first input of the driver;
   a bipolar device having a current gain, and comprising an output of the driver, said bipolar device being connected to said field effect device and driven thereby;
   a semiconductor substrate defining a second input of the driver, and connected in common to said bipolar device and said field effect device, and operative for driving said output of the driver; and
   said field efect device responsive to a signal applied to said first input driving current in a first direction through said output, and said bipolar device responsive to a signal applied to said second input for driving current in a second direction through said output.

2. The solid state driver of claim 1 wherein said field effect device comprises a double diffused field effect transistor.

3. The solid state driver of claim 1 wherein said bipolar device comprises a SCR.

4. The solid state driver of claim 3 wherein said SCR comprises semiconductor regions parasitic to said field effect device.

5. The solid state driver of claim 1 wherein said substrate and the bipolar device further comprise a unidirectional conduction means connected between said substrate and said output.

6. The solid state driver of claim 1 further including a third input for disabling said bipolar device.

7. The solid state driver of claim 6 wherein said third input is connected to means for varying a resistance so as to control conduction of said bipolar device.

8. The solid state driver of claim 1 wherein said bipolar device includes an NPN transistor and a PNP transistor connected as an SCR.

9. The solid state driver of claim 7 wherein said NPN and PNP transistors include semiconductor regions parasitic to said field effect device.

* * * * *